United States Patent [19]

Strangman

[11] Patent Number: 5,512,382
[45] Date of Patent: Apr. 30, 1996

[54] POROUS THERMAL BARRIER COATING

[75] Inventor: Thomas E. Strangman, Phoenix, Ariz.

[73] Assignee: AlliedSignal Inc., Morris Township, N.J.

[21] Appl. No.: 436,846

[22] Filed: May 8, 1995

[51] Int. Cl.$^6$ ..................................................... B32B 15/04
[52] U.S. Cl. .......................... 428/632; 428/633; 428/629; 428/678; 428/472; 428/669; 428/670; 428/672
[58] Field of Search ..................................... 428/633, 623, 428/678, 469, 472, 472.1, 669, 670, 672, 652, 629, 632

[56] References Cited

U.S. PATENT DOCUMENTS

| | | |
|---|---|---|
| 2,927,043 | 3/1960 | Stetson . |
| 3,410,716 | 11/1968 | Hiltz ........................................ 428/332 |
| 3,415,672 | 12/1968 | Levinstein et al. . |
| 3,489,537 | 1/1970 | Cook . |
| 3,849,865 | 11/1974 | Gedwill et al. ............................ 29/460 |
| 3,869,779 | 3/1975 | Gedwill et al. . |
| 3,940,569 | 2/1976 | Schonbrun et al. . |
| 3,955,935 | 5/1976 | Shockley et al. . |
| 3,978,251 | 8/1976 | Stetson et al. ........................... 427/229 |
| 3,979,534 | 9/1976 | Rairden, III ............................. 427/405 |
| 3,996,021 | 12/1976 | Chang et al. . |
| 4,005,989 | 2/1977 | Preston . |
| 4,080,486 | 3/1978 | Walker et al. ........................... 428/653 |
| 4,269,903 | 5/1981 | Clingman et al. ....................... 428/633 |
| 4,321,310 | 3/1982 | Ulion et al. .............................. 428/612 |
| 4,321,311 | 3/1982 | Strangman ............................... 428/623 |
| 4,335,190 | 6/1982 | Bill et al. ................................. 428/623 |
| 4,374,183 | 2/1983 | Deadmore et al. ...................... 428/641 |
| 4,399,199 | 8/1983 | McGill et al. ........................... 428/633 |
| 4,401,697 | 8/1983 | Strangman ............................... 427/250 |
| 4,405,659 | 9/1983 | Strangman ............................ 427/248.1 |
| 4,405,660 | 9/1983 | Ulion et al. ........................... 427/248.1 |
| 4,414,249 | 11/1983 | Ulion et al. ........................... 427/248.1 |
| 4,447,503 | 5/1984 | Dardi et al. .............................. 428/632 |
| 4,639,399 | 1/1987 | Aprigliano .............................. 428/623 |
| 4,676,994 | 6/1987 | Demaray ................................. 427/566 |
| 4,880,614 | 11/1989 | Strangman et al. ..................... 428/623 |
| 4,916,022 | 4/1990 | Solfest et al. ........................... 428/623 |
| 5,015,502 | 5/1991 | Strangman et al. .................. 427/248.1 |
| 5,238,752 | 8/1993 | Duderstadt et al. ..................... 428/623 |

OTHER PUBLICATIONS

"Thermal Barrier Coating Life Prediction Model Development", S. M. Meier, et al., NASA Contractor Report No. 18911, Jul. 1991, pp. 20 & 180.

"Oxidation of Low Sulfur Single Crystal Nickel–Base Superalloys", McVay et al., *Superalloys 1992*, pp. 807–816. (No month).

"Allison Engine Testing CMSC-4 Single Crystal Turbine Blade and Vanes", Burkholder, et al., Apr. 25–27, 1995.

*Primary Examiner*—Michael Lewis
*Assistant Examiner*—N. M. Nguyen
*Attorney, Agent, or Firm*—Jerry J. Holden; James W. McFarland

[57] ABSTRACT

A thermal barrier coating for superalloy turbine engine vanes and blades that are exposed to high temperature gas is disclosed. The coating includes a ceramic layer applied to an Aluminide or MCrAlY bond coat by electron beam physical vapor deposition. The ceramic layer has a first portion having unstabilized porosity, a second portion, overlying the first portion, with stabilized porosity, and an outer portion wherein the pores are coated with a noble metal. The stabilized porosity portion along with the noble metal coating reduce the thermal conductivity of the ceramic layer. Stabilizing the porosity renders it more resistant to sintering densification at high temperatures.

9 Claims, 1 Drawing Sheet

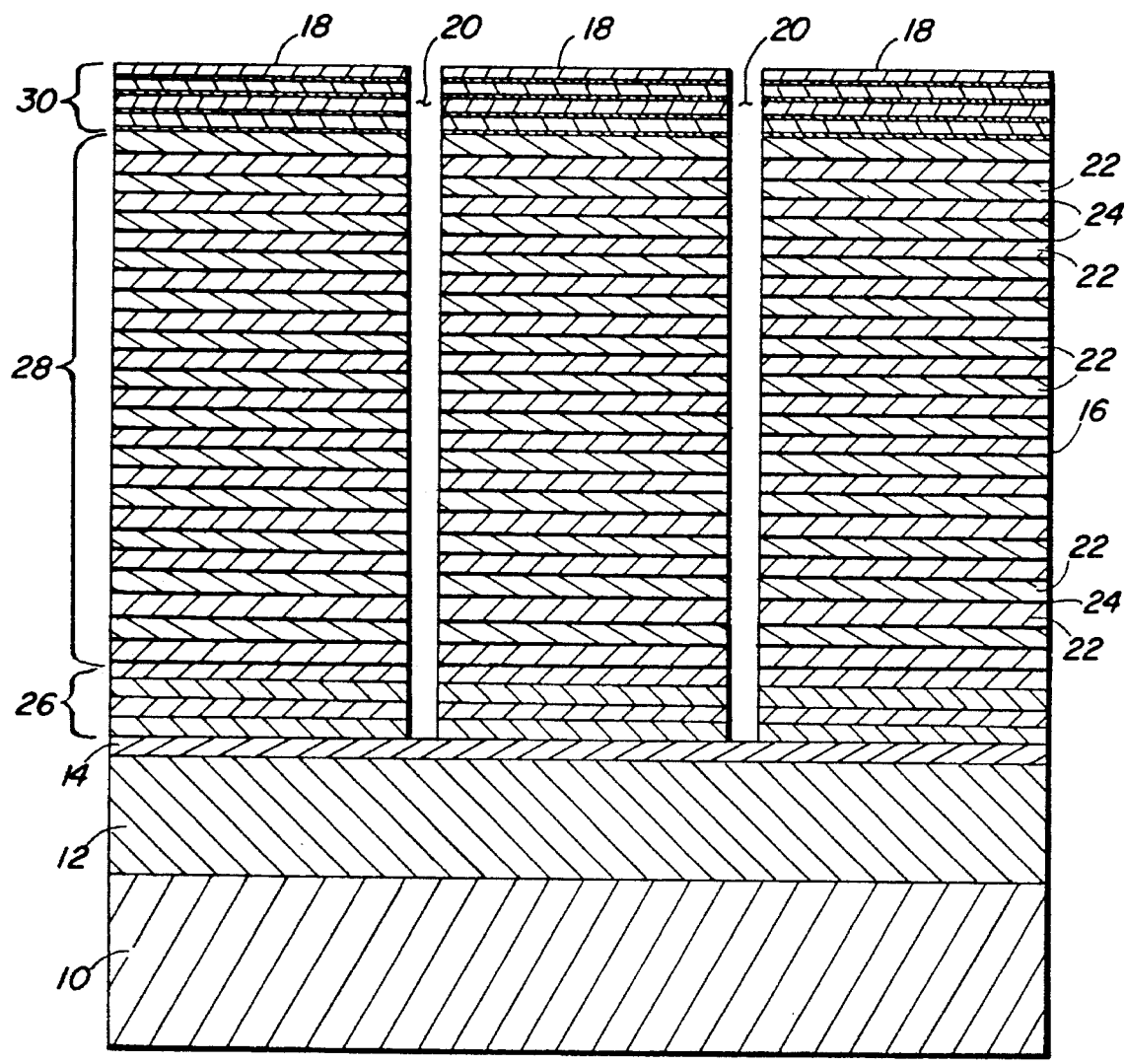

POROUS THERMAL BARRIER COATING

TECHNICAL FIELD

This invention relates generally to thermal barrier coatings for superalloy substrates and in particular to a multilayer, ceramic thermal barrier coating having low thermal conductivity for superalloy blades and vanes in gas turbine engines.

BACKGROUND OF THE INVENTION

As gas turbine engine technology advances and engines are required to be more efficient, gas temperatures within the engines continue to rise. However, the ability to operate at these increasing temperatures is limited by the ability of the superalloy turbine blades and vanes to maintain their mechanical strength when exposed to the heat, oxidation, and corrosive effects of the impinging gas. One approach to this problem has been to apply a protective thermal barrier coating which insulates the blades and vanes and inhibits oxidation and hot gas corrosion.

Typically, thermal barrier coatings are applied to a superalloy substrate and include a bond coat and a ceramic top layer. The ceramic top layer is applied either by the process of plasma spraying or by the process of electron beam physical vapor deposition (EB-PVD). Use of the EB-PVD process results in the outer ceramic layer having a columnar grained microstructure. Gaps between the individual columns allow the columnar grains to expand and contract without developing stresses that could cause spalling. Strangman, U.S. Pat. Nos. 4,321,311, 4,401,697, and 4,405,659 disclose thermal barrier coatings for superalloy substrates that contain a MCrAlY layer, an alumina layer, and an outer columnar grained ceramic layer. Duderstadt, et al., U.S. Pat. No. 5,238,752, and Strangman copending U.S. patent application Ser. No. 06/603,811 disclose a thermal barrier coating for a superalloy substrate that contains an aluminide layer, an alumina layer, and an outer columnar grained ceramic layer.

A disadvantage to ceramic top layers applied by commercially available EB-PVD processes is that their thermal conductivity is about two times higher than the thermal conductivity of ceramic top layers applied by the plasma spray process. High thermal conductivity is undesirable and is believed to result from the deposition of relatively high density columnar grains with little internal microporosity.

Accordingly, there is a need for a thermal barrier coating and method therefor to be applied by EB-PVD that has a lower thermal conductivity.

SUMMARY OF THE INVENTION

An object of the present invention is to provide a superalloy article having a thermal barrier coating which can be applied by EB-PVD that has a lower thermal conductivity.

Another object of the present invention is to provide a method for applying such a coating.

The present invention achieves these objects by providing a thermal barrier coating that includes an aluminide or MCrAlY bond coat and a ceramic layer applied to the bond coat by electron beam physical vapor deposition. The ceramic layer has a first portion with unstabilized porosity, a second portion, overlying the first portion, with stabilized porosity, and an outer portion wherein the pores are coated with a noble metal. The stabilized porosity portion along with the noble metal coating reduce the thermal conductivity of the ceramic layer, rendering it more resistant to sintering densification at high temperatures.

BRIEF DESCRIPTION OF THE DRAWINGS

The sole FIGURE is a cross sectional schematic of a coated article as contemplated by the present invention.

DESCRIPTION OF THE PREFERRED EMBODIMENT

Referring to the drawing, a base metal or substrate 10 is a nickel, cobalt or iron based high temperature alloy from which turbine airfoils are commonly made. Preferably, the substrate 10 is a superalloy having hafnium and/or zirconium such as MAR-M247 and MAR-M 509, the compositions of which are shown in Table 1.

TABLE 1

| Alloy | Mo | W | Ta | Al | Ti | Cr | Co | Hf | V | Zr | C | B | Ni |
|---|---|---|---|---|---|---|---|---|---|---|---|---|---|
| Mar-M247 | .65 | 10 | 3.3 | 5.5 | 1.05 | 8.4 | 10 | 1.4 | — | .055 | .15 | .15 | bal. |
| Mar-M509 | — | 7.0 | 3.5 | — | 0.25 | 23.4 | Bal. | — | — | .5 | .6 | — | 10.0 |

A bond coat 12 lies over the substrate 10. The bond coat 12 is usually comprised of a MCrAlY alloy. Such alloys have a broad composition of 10 to 35% chromium, 5 to 15% aluminum, 0.01 to 1% yttrium, or hafnium, or lanthanum, with M being the balance. M is selected from a group consisting of iron, cobalt, nickel, and mixtures thereof. Minor amounts of other elements such as Ta or Si may also be present. The MCrAlY bond coat is preferably applied by EB-PVD through sputtering, low pressure plasma or high velocity oxy fuel spraying or entrapment plating may also be used.

Alternatively, the bond coat 12 can be comprised of an intermetallic aluminide such as nickel aluminide or platinum aluminide. The aluminide bond coat can be applied by standard commercially available aluminide processes whereby aluminum is reacted at the substrate surface to form an aluminum intermetallic compound which provides a reservoir for the growth of an alumina scale oxidation resistant layer. Thus the aluminide coating is predominately composed of aluminum intermetallic [e.g., NiAl, CoAl, FeAl and (Ni, Co, Fe)Al phases] formed by reacting aluminum vapor species, aluminum rich alloy powder or surface layer with the substrate elements in the outer layer of the superalloy component. This layer is typically well bonded to the substrate. Aluminiding may be accomplished by one of several conventional prior art techniques, such as, the pack cementation process, spraying, chemical vapor deposition, electrophoresis, sputtering, and slurry sintering with an aluminum rich vapor, entrapment plating and appropriate diffusion heat treatments. Other beneficial elements can also be incorporated into diffusion aluminide coatings by a variety of processes. Beneficial elements include Pt, Pd, Si, Hf, Y and oxide particles, such as alumina, yttria, hafnia, for enhancement of alumina scale adhesion, Cr and Mn for hot corrosion resistance, Rh, Ta and Cb for diffusional stability and/or oxidation resistance and Ni, Co for increasing ductility or incipient melting limits.

In the specific case of platinum modified diffusion aluminide coating layers, the coating phases adjacent to the alumina scale will be platinum aluminide and/or nickel-platinum aluminide phases (on a Ni-base superalloy).

Through oxidation an alumina or aluminum oxide layer 14 is formed over the bond coat 12. This alumina layer 14 provides both oxidation resistance and a bonding surface for a ceramic coat 16. The alumina layer may be formed before the ceramic coat 16 is applied, during application of coat 16, or subsequently by heating the coated article in an oxygen containing atmosphere at a temperature consistent with the temperature capability of the superalloy, or by exposure to the turbine environment. The sub-micron thick alumina scale will thicken on the aluminide surface by heating the material to normal turbine exposure conditions. The thickness of the alumina scale is preferably sub-micron (up to about one micron). The alumina layer 14 may also be formed by chemical vapor deposition following deposition of the bond coat 12.

Alternatively, the bond 12 can be eliminated if the substrate 10 is capable of forming a highly adherent alumina scale or layer 14. Examples of such substrates are PWA 1487 which contain 0.1% yttrium, Rene N5, and low sulphur versions of single crystal alloys SC180 or CMSX-3.

The ceramic coat 16 may be any of the conventional ceramic compositions used for this purpose. A preferred composition is the yttria stabilized zirconia coating. The zirconia may be stabilized with CaO, MgO, CeO$_2$ as well as Y$_2$O$_3$. Another ceramic believed to be useful as the columnar type coating material within the scope of the present invention is hafnia which can be yttria-stabilized. The particular ceramic material selected should be stable in the high temperature environment of a gas turbine. The thickness of the ceramic layer may vary from 1 to 1000 microns but is typically in the 50 to 300 microns range.

The ceramic coat 16 is applied by EB-PVD and as result has a columnar grained microstructure. The columnar grains or columns 18 are oriented substantially perpendicular to the surface of the substrate 10 and extend outward from the bond coat 12. Between the individual columns 18 are micron sized intercolumnar gaps 20 that extend from the outer surface of the ceramic coat 16 to the alumina layer 14.

During EB-PVD the columnar grains 18, which are well bonded to the alumina layer 14, are grown by sequential deposition or condensation of submicron layers 22 of zirconia each time that the substrate 10 is rotated over the electron beam heated zirconia vapor source. As each layer is applied, small submicron pores form, primarily on the interfaces 24 between the layers 22. This naturally forming porosity is unstable with respect to sintering densification at high temperatures. The term porosity as used herein means the quality or state of being porous.

In the portion 26 adjacent the alumina layer 14 of the grains 18, low levels of natural porosity is considered beneficial in achieving good bonding to the alumina layer 14. The portion 26 is preferably only a few microns in thickness.

Overlying the portion 26 is a second portion 28 having a porosity that is greater than in the portion 26 and which is stabilized. This stable microporosity is achieved by introducing a small concentration of metallic vapor such as tungsten or molybdenum into the EB-PVD process. The tungsten or molybdenum can be introduced by several methods such as a second EB-PVD evaporation source, a sputtering target, a thermally decomposable gas containing one of these elements, or the addition of tungsten or molybdenum powder or wire to the stabilized zirconia evaporation source.

The amount of tungsten or molybdenum added to the zirconia is a sufficient amount to produce isolated submicron particle (W or Mo atom clusters), on the zirconia layer interfaces 24 or in the layers 22 themselves. Because zirconia is permeable to oxygen, the atom clusters readily oxidize when exposed to a high temperature oxidizing environment. Typically, EB-PVD process occurs at a temperature in the range of 950° C. to 1100° C. at an oxygen pressure of 0.5 to 2.5 millitorr. These conditions may be sufficient to nucleate and grow gas porosity during deposition. Alternatively, the porosity can be grown and stabilized during an oxidizing, post coating heat treatment. As the gaseous oxides of Molybdenum and tungsten are large molecules, the zirconia lattice hinders their diffusion. As a result, sintering densification is inhibited and the porosity is stabilized. Typically, the pores within the portion 28 will have a diameter of about 5.0 to 500.0 nanometers.

The amount of tungsten or molybdenum added to the zirconia must be limited so as to prevent the extensive formation of channels interconnecting the pores. These channels reduce the strength of the grains, making them prone to erosion. Also, the gaseous oxides can escape through these channels into the atmosphere.

Overlying the portion 28 is an outer portion 30 in which the reflectivity of the pores is increased by sputtering a noble metal (i.e., Pt, Au, Rh, Pd, Ir) concurrently with the deposition of the zirconia. The noble metal atoms are attracted to the tungsten and molybdenum to form intermetallic particles. After the tungsten and molybdenum oxidizes, the noble metal vapor coats the surfaces of the pores, enhancing their reflectivity. Preferably, the portion 30 has a thickness of about 5 to 25 microns.

The stabilized porosity portion along with the noble metal coated pores reduce the thermal conductivity of the ceramic layer 16 rendering it more resistant to sintering densification at high temperatures.

Various modifications and alterations to the above-described preferred embodiment will be apparent to those skilled in the art. Accordingly, this description of the invention should be considered exemplary and not as limiting the scope and spirit of the invention as set forth in the following claims.

What is claimed is:

1. A superalloy article having a ceramic thermal barrier coating on at least a portion of its surface, comprising:

a superalloy substrate;

a bond coat overlying the substrate and selected from the group consisting of aluminides and MCrAlY where M is a metal selected from the group consisting of iron, cobalt, nickel, and mixtures thereof; and a ceramic coat applied to said bond coat by electron beam physical vapor deposition, said ceramic coat including a first portion of unstabilized porosity with respect to sintering densification adjacent said bond coat, and a second portion of stabilized porosity with respect to sintering densification overlying said first portion.

2. The article of claim 1 further including an outer portion of stabilized porosity with respect to sintering densification wherein said pores are coated with a noble metal.

3. The article of claim 2 wherein said outer portion has a thickness of about 5 to 25 microns.

4. The article of claim 1 wherein said porosity of said second portion includes pores having a diameter of about 5 to 500 nanometers.

5. A thermal barrier coating system for a superalloy substrate, comprising:

a bond coat overlying the substrate and selected from the group consisting of aluminide and MCrAlY where M is a metal selected from the group consisting of iron, cobalt, nickel, and mixtures thereof; and a ceramic coat applied to said bond coat by electron beam physical vapor deposition, said ceramic coat including a first portion of unstabilized porosity with respect to sintering densification adjacent said bond coat, and a second portion of stabilized porosity with respect to sintering densification overlying said first portion.

6. The article of claim 5 further including an outer portion of stabilized porosity with respect to sintering densification wherein said pores are coated with a noble metal.

7. The article of claim 6 wherein said outer portion has a thickness of about 5 to 25 microns.

8. The article of claim 5 wherein said porosity of said second portion includes pores having a diameter of about 5 to 500 nanometers.

9. A superalloy article having a ceramic thermal barrier coating on at least a portion of its surface, comprising:

a superalloy substrate with an adherent alumina scale thereon; and a ceramic coat applied to said alumina scale by electron beam physical vapor deposition, said ceramic coat including a first portion of unstabilized porosity with respect to sintering densification adjacent said bond coat, and a second portion of stabilized with respect to sintering densification porosity overlying said first portion.

* * * * *

UNITED STATES PATENT AND TRADEMARK OFFICE
CERTIFICATE OF CORRECTION

PATENT NO.  : 5,512,382

DATED       : April 30, 1996

INVENTOR(S) : Thomas E. Strangman

It is certified that error appears in the above-identified patent and that said Letters Patent is hereby corrected as shown below:

Col. 6, line 14, after "stabilized", insert --porosity--.

Signed and Sealed this

Twenty-third Day of July, 1996

Attest:

BRUCE LEHMAN

Attesting Officer

Commissioner of Patents and Trademarks